US007339117B2

(12) United States Patent
Tarte et al.

(10) Patent No.: US 7,339,117 B2
(45) Date of Patent: Mar. 4, 2008

(54) MULTI-CONDUCTOR ELECTRICAL CONNECTOR CABLE HAVING IMPROVED ELECTROMAGNETIC CHARACTERISTICS

(75) Inventors: Christopher Timothy Tarte, Atlanta, GA (US); Hiroyasu Sugiyama, San Diego, CA (US)

(73) Assignee: Panasonic Automotive Systems Company of America, division of Panasonic Corporation of North America, Peachtree City, GA (US)

( * ) Notice: Subject to any disclaimer, the term of this patent is extended or adjusted under 35 U.S.C. 154(b) by 0 days.

(21) Appl. No.: 11/429,676

(22) Filed: May 8, 2006

(65) Prior Publication Data

US 2007/0256855 A1 Nov. 8, 2007

(51) Int. Cl.
*H01B 7/08* (2006.01)
(52) U.S. Cl. .................................................. 174/117 F

(58) Field of Classification Search ............ 174/117 F, 174/117 FF
See application file for complete search history.

(56) References Cited

U.S. PATENT DOCUMENTS 3,627,903 A * 12/1971 Plummer .................. 174/72 A
4,891,616 A * 1/1990 Renken et al. .............. 333/236

* cited by examiner

*Primary Examiner*—Chau N. Nguyen
(74) *Attorney, Agent, or Firm*—Laurence S. Roach

(57) ABSTRACT

A multi-conductor electrical connector member includes a plurality of electrical conductors arranged in a spaced apart and generally parallel side-by-side manner. The plurality of electrical conductors includes a signal source end. At least one electrical discontinuity is formed in a selected subset of the plurality of electrical conductors. The at least one electrical discontinuity is formed proximate the signal source end in order to improve the electromagnetic characteristics of the multi-conductor electrical connector member.

3 Claims, 3 Drawing Sheets

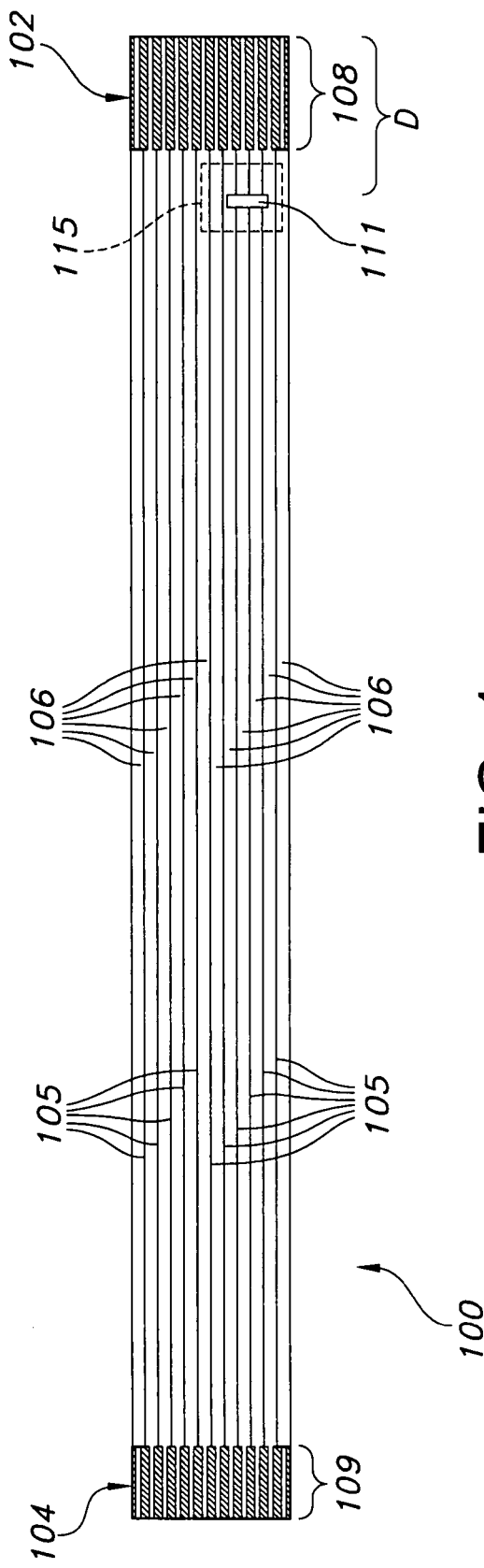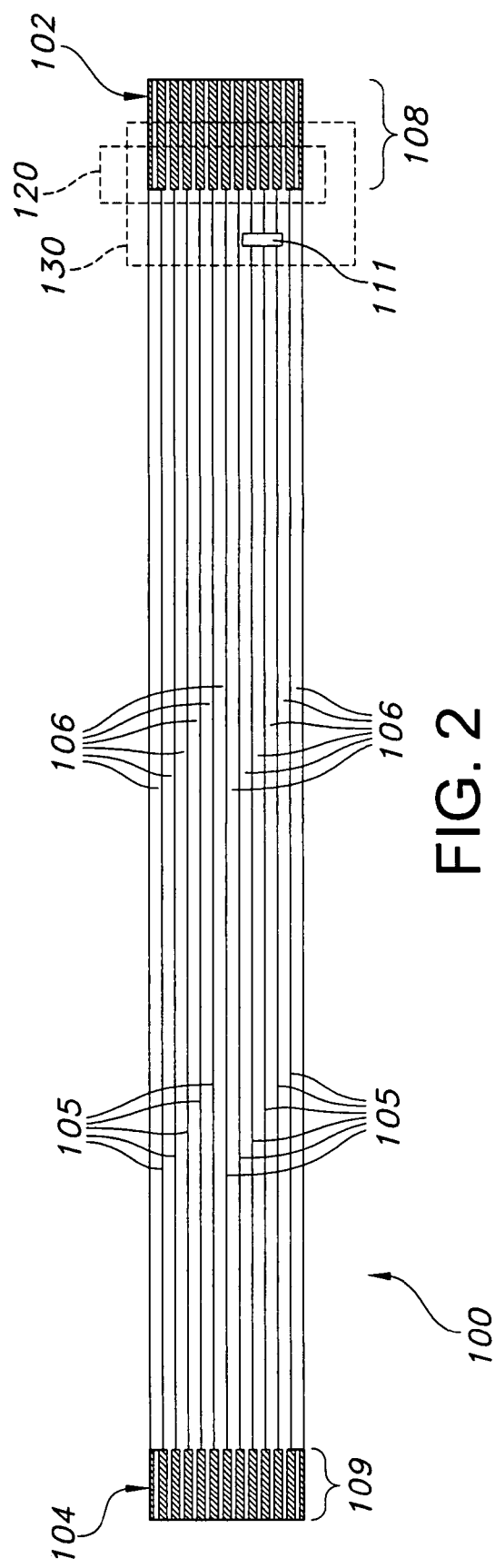

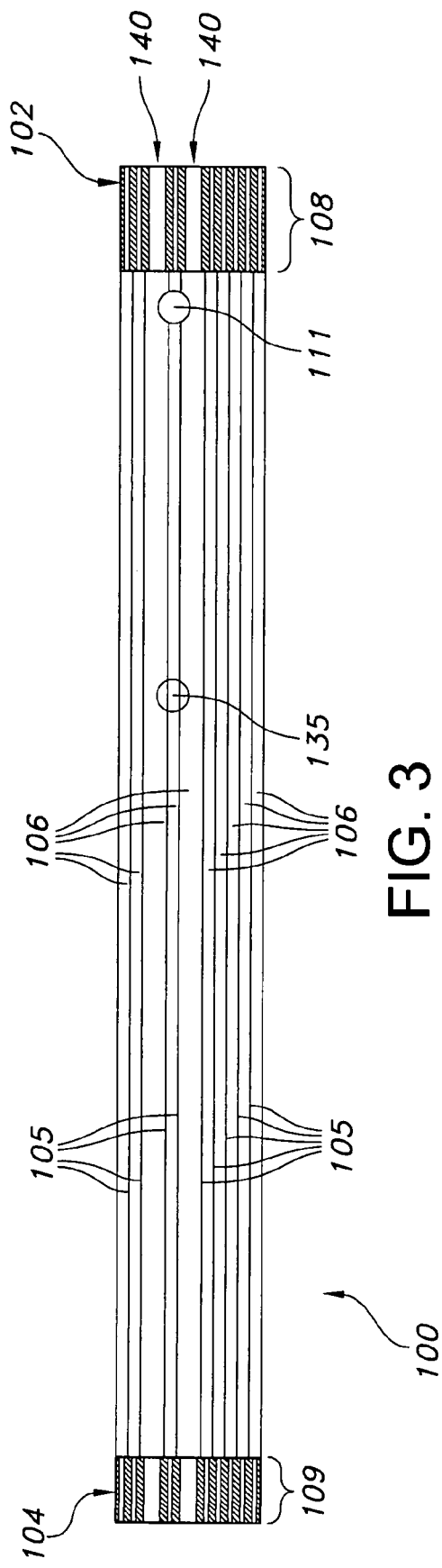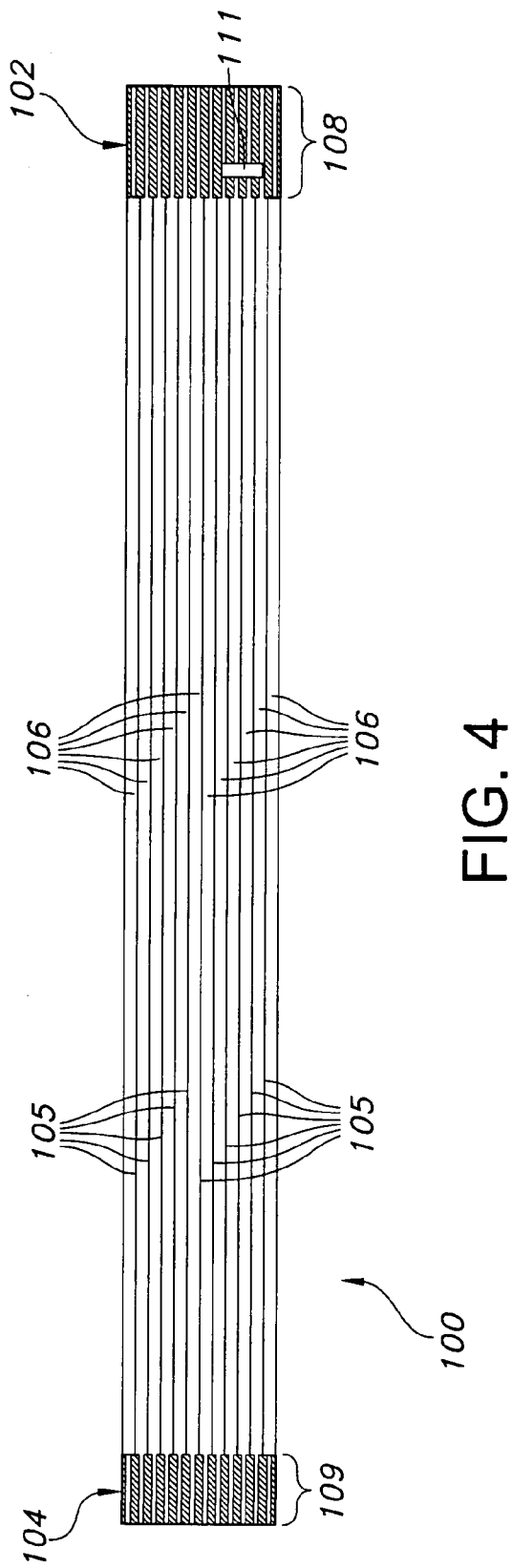

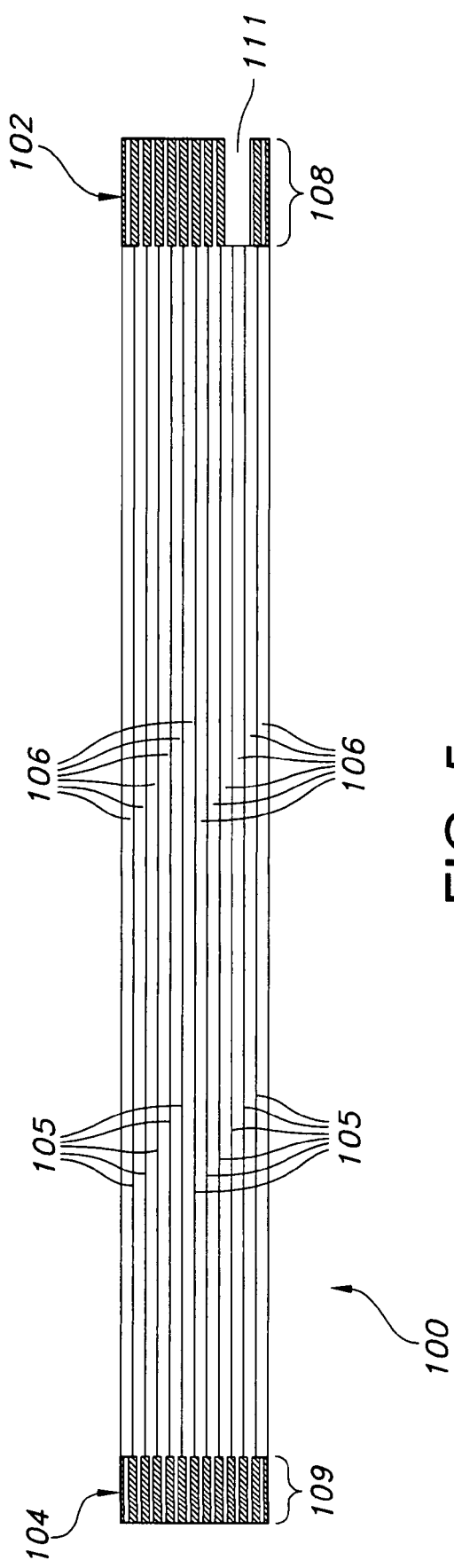
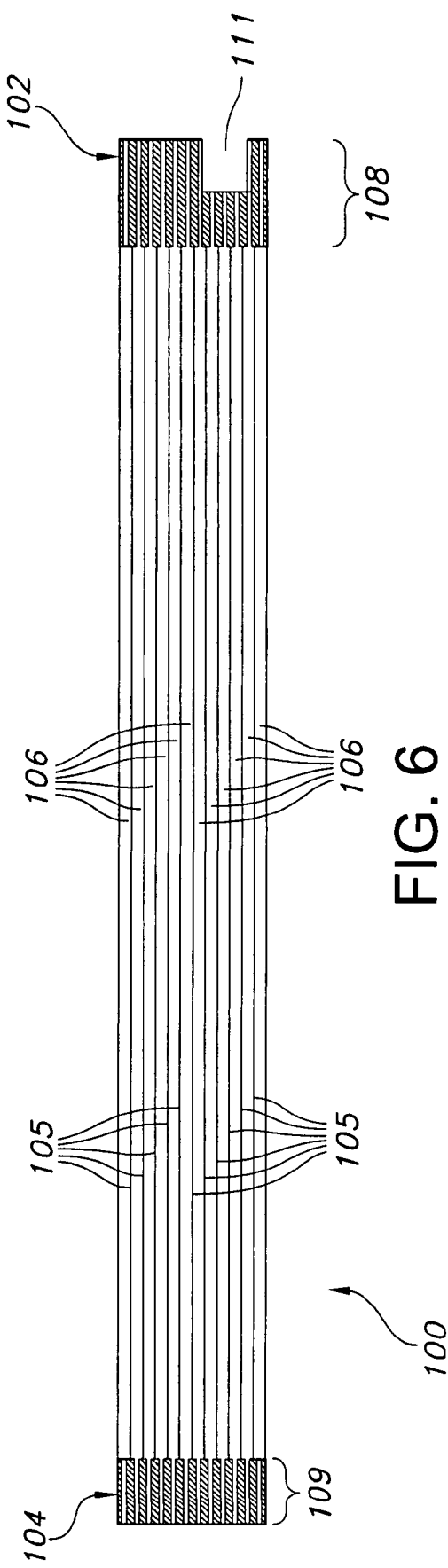
FIG. 5
FIG. 6

MULTI-CONDUCTOR ELECTRICAL CONNECTOR CABLE HAVING IMPROVED ELECTROMAGNETIC CHARACTERISTICS

BACKGROUND OF THE INVENTION

1. Field of the Invention

The present invention relates to multi-conductor electrical connector cables having improved electromagnetic characteristics.

2. Statement of the Problem

Multi-conductor electrical connector cables, such as ribbon cables, harnesses, flexible printed circuits, etc., are used in virtually all electronic devices. Such multi-conductor electrical connector cables typically comprise a plurality of electrical conductors extending between two (or more) ends or connectors. Such multi-conductor electrical connector cables are used to conduct signals within and/or into and/or out of the device.

In order to achieve economies of scale, multi-conductor electrical connector cables are mass-produced. Mass-produced multi-conductor electrical connector cables, although readily available and relatively inexpensive, are available in a limited number of standard configurations. Thus, mass-produced multi-conductor electrical connector cables tend to be relatively inflexible in that they are available with a predetermined or standard number of conducting members or cables. For example, standard multi-conductor electrical connector cables are typically available with four, eight, sixteen and/or thirty-two conducting members. Thus, depending on the particular application in which a mass-produced multi-conductor electrical connector cable is utilized, there may be one or more conductors that are not utilized and do not carry signals.

Where a mutli-conductor electrical connector cable is carrying electrical signals having certain properties, such as, for example, a certain power level and/or frequency, a nearby or adjacent unused conductor member may undesirably radiate or receive electromagnetic energy. In effect, the unused conductor member undesirably acts as an antenna by radiating and/or receiving electromagnetic energy and/or radiation. Such electromagnetic radiation emitted or received by the unused electrical conductor or conductors of a multi-conductor electrical connector cable may result in interference. The electrical interference may undesirably affect or degrade the performance of other nearby electrical components and/or the device. In addition, the electrical interference may be picked up by other conductors of the multi-conductor electrical connector cable and be returned to the circuit that is generating the interfering signal.

One approach that has been used to address the above-described problem is to specially-design multi-conductor electrical connector cables for each specific application. Such specially-designed multi-conductor electrical connector cables remove unused conductors from the design of the multi-conductor electrical connector cable. However, custom designing a multi-conductor electrical connector cable for each and every application is costly and inefficient in terms of time and resource utilization. Omission of one or more conductors from an existing or standard multi-conductor electrical connector cable design may degrade the mechanical properties, e.g., strength and/or reliability, of the standard multi-conductor electrical connector cable.

A second approach that has been used is to provide the multi-conductor electrical connector cable with a jacket or cover made of a material that absorbs or shields electromagnetic radiation. This approach, however, is also costly and may not shield the multi-conductor electrical conducting members from each other. Further, this approach does nothing to address the issue of unutilized conductors within the multi-conductor electrical connector cable.

Therefore, what is needed in the art is a multi-conductor electrical connector cable having improved electromagnetic characteristics, including reduced sensitivity to and reduced emission of electromagnetic radiation.

SUMMARY OF THE INVENTION

A multi-conductor electrical connector cable is provided according to an embodiment of the invention. The multi-conductor electrical connector cable comprises a plurality of electrical conductors arranged in a substantially side-by-side manner. The multi-conductor electrical connector cable includes a signal source end. The multi-conductor electrical connector cable further comprises one or more openings disposed therein proximate to the signal source end. The one or more openings form a discontinuity in one or more electrical conductors of the plurality of electrical conductors.

DESCRIPTION OF THE DRAWINGS

The above-mentioned and other features and advantages of the present invention, and the manner of attaining them, will become apparent and be better understood by reference to the following description of one embodiment of the invention in conjunction with the accompanying drawings, wherein:

FIG. 1 shows an electrical connector member according to an embodiment of the invention.

FIG. 2 shows the electrical connector member according to an embodiment of the invention.

FIG. 3 shows the electrical connector member according to an embodiment of the invention.

FIG. 4 shows the electrical connector member according to an embodiment of the invention.

FIG. 5 shows the electrical connector member according to an embodiment of the invention.

FIG. 6 shows the electrical connector member according to an embodiment of the invention.

Corresponding reference characters indicate corresponding parts throughout the several views. The exemplifications set out herein illustrate a preferred embodiment of the invention, in one form, and such exemplifications are not to be construed as limiting in any manner the scope of the invention.

DETAILED DESCRIPTION OF THE INVENTION

FIGS. 1-6 and the following description depict specific examples to teach those skilled in the art how to make and use the best mode of the invention. For the purpose of teaching inventive principles, some conventional aspects have been simplified or omitted. Those skilled in the art will appreciate variations from these examples that fall within the scope of the invention. Those skilled in the art will appreciate that the features described below can be combined in various ways to form multiple variations of the invention. As a result, the invention is not limited to the specific examples described below, but only by the claims and their equivalents.

FIG. 1 shows an electrical connector member 100 according to an embodiment of the invention. The electrical connector member 100 can comprise an electrical harness, an electrical cable, a flexible printed circuit, etc. The electrical connector member 100 comprises a signal source end 102, at least a second end 104, and a plurality of electrical conductors 105 extending from the signal source end 102 to the second end 104. It should be understood that the electrical connector member 100 can include more than two ends, including more than one signal source end 102.

The plurality of electrical conductors 105 comprise any manner of conductors. In one embodiment, the plurality of electrical conductors 105 comprises electrically conductive wires. Alternatively, in another embodiment the plurality of electrical conductors 105 comprises lines or traces of conductive material formed, such as, for example, printed or screened, onto a flexible printed circuit substrate. The plurality of electrical conductors 105 are covered by, formed in, surrounded by and/or spaced apart by an electrically insulating material 106.

The plurality of electrical conductors 105 are arranged in a spaced-apart side-by-side and generally linear and/or generally parallel manner. A plurality of first contacts 108 are formed at, disposed on, and/or integral with signal source end 102 and are each electrically connected to a corresponding one of the electrical conductors 105. Likewise, a plurality of second contacts 109 are formed at, disposed on, and/or integral with second end (or ends) 104 and are each electrically connected to a corresponding one of electrical conductors 105. Therefore, the plurality of electrical conductors 105 electrically connects the plurality of first contacts 108 with the plurality of second contacts 109.

The signal source end 102 and the second end 104 can fit into and be received by any manner of socket or receptacle. The signal source end 102 and the second end 104 can include any manner of connector body (not shown).

According to the invention, the electrical connector member 100 is interrupted by one or more electrical discontinuities 111, such as, for example, openings, holes, gaps or similar electrical discontinuities and/or mechanical interruptions. For convenience, electrical discontinuities 111 are sometimes hereinafter generally and alternately referred to as openings 111. However, it is to be understood that the invention is not so limited.

More particularly, opening 111 is defined at least in part by and passes entirely through a subset (i.e., one or more) of the plurality of electrical conductors 105 thereby forming an electrical discontinuity in the subset (i.e., one or more) electrical conductors 105 through which opening 111 passes and/or in which opening 111 is defined. Opening 111 reduces the length or portion of the corresponding electrical conductors 105 connected to first contacts 108. The reduced length or portion of electrical conductors 105 connected to first contacts 108 reduces and/or minimizes undesirable electromagnetic radiation emitted and/or received by the conductor proximate signal source end 102, and thereby improves the electromagnetic characteristics of electrical connector member 100.

It should be understood that each opening 111 interrupts or forms an electrical discontinuity in the subset of the plurality of electrical conductors 105 in which it is formed. In addition, it should also be understood that multiple openings 111 can be formed in one or more subsets of the plurality of electrical conductors 105.

The one or more openings 111 are formed proximate and/or adjacent to the signal source end 102 and at a predetermined distance D therefrom. As will be appreciated by one of ordinary skill in the art, the predetermined distance D is determined according to various desired factors, such as, for example, the frequency and/or magnitude of the corresponding electrical signals carried by the conductors, the presence or absence of a connector body, the size of the individual conductors, etc.

The figure further shows an optional protective covering portion 115 placed on the electrical connector member 100 according to an embodiment of the invention. The protective covering portion 115 is placed over and covers an opening (or openings) 111. The protective covering portion 115 is placed on at least one side of the electrical connector member. In some embodiments, the protective covering portion 115 is place on both sides, such as a protective covering portion 115 that wraps around the plurality of electrical conductors 105.

In one embodiment, the protective covering portion 115 comprises a tape portion that adheres to the electrical connector member 100. Alternatively, the protective covering portion 115 is affixed to the electrical connector member 100 in other ways, such as, for example, by molding, adhesive, shrink wrap, or other suitable methods.

The protective covering portion 115 adds mechanical strength to the plurality of electrical conductors 105 and/or to electrical connector member 100. The protective covering portion 115 also prevents separation of the conductors and/or insulator material 106. If multiple conductors are interrupted by opening 111, the protective covering portion 115 keeps the interrupted conductors separated from each other and prevents electrical shorting between the conductors themselves and the shorting of the conductors to external components and/or structures. Further, the protective covering portion 115 prevents moisture, dirt, corrosive materials, etc., from contacting the severed ends of the conductors.

In one embodiment, the protective covering portion 115 is substantially transparent. Consequently, the protective covering portion 115 does not obscure an opening 111, wherein a person can see that one or more conductors 105 have been interrupted. Further, the transparency of the protective covering portion 115 enables inspection of an opening 111 in order to do a quality control check or otherwise inspect the interruption of a conductor(s) 105 and determine the general condition of the electrical connector member 100.

The openings 111 are formed in any manner. For example, an opening 111 can be punched or cut in the electrical connector member 100. However, other methods of forming an opening are contemplated and are within the scope of the description and claims.

The one or more openings 111 are of any shape or outline. An opening 111 can be regular and/or rectangular, as shown in FIG. 1. An opening 111 can be substantially circular or ovoid, as shown in FIG. 3. However, other shapes or outlines are contemplated and are within the scope of the description and claims.

FIG. 2 shows the electrical connector member 100 according to an embodiment of the invention. This figure additionally shows locations of an optional connector body 120 or 130 positioned at the signal source end 102. The connector body 120 or 130 is affixed to the electrical connector member 100 in any manner. In use, connector body 120 or 130 is received within a corresponding connector receptacle (not shown).

In a first embodiment, the connector body 120 is relatively small and does not cover or obstruct the opening 111 (dashed lines). Alternatively, in another embodiment the connector body 130 is relatively large and covers the opening 111, protecting the opening 111 from contact and from moisture, dirt, etc., as previously discussed.

FIG. 3 shows the electrical connector member 100 according to an embodiment of the invention. In this embodiment, unused electrical conductors 135 are grouped adjacent to each other. The adjacent grouping of unused electrical conductors 135 is interrupted by opening 111, as shown. The adjacent grouping of unused electrical conductors increases the efficiency with which the electrical conductors are interrupted by making it necessary to form only one opening 111 and reduces the likelihood of cutting or damaging other conductors during the forming of opening 111.

In addition, by grouping unused electrical conductors 135 adjacent to each other, the unused electrical conductors are separated from other conductors or groupings of conductors by isolation bands 140. The isolation bands 140 comprise wider strips of insulator material 106. If one or more isolation bands 140 are included in the electrical connector member 100, then the opening or openings 111 are formed more easily and with less restrictive process tolerances for forming the openings.

FIG. 4 shows the electrical connector member 100 according to an embodiment of the invention. In this embodiment, the one or more openings 111 are formed entirely through a portion of selected or desired first contacts 108. Opening 111 can extend entirely through the signal source end 102 or, alternatively, merely pass through the desired first contacts 108 and not through a backing layer of reinforcing material (not shown) that is sometimes disposed at or proximate to signal source end 102.

FIG. 5 shows the electrical connector member 100 according to an embodiment of the invention. In this embodiment, the one or more openings 111 comprise a notching-out of selected ones of the plurality of first contacts 108. This embodiment ensures there is no portion of unused first contacts 108 extending from a corresponding connector body or device.

FIG. 6 shows the electrical connector member 100 according to an embodiment of the invention. In this embodiment, the one or more openings 111 comprise a partial notching-out of desired ones of the plurality of first contacts 108. As a result, the remaining portions of first contacts 108 do not engage or electrically contact corresponding features on an electrical connector body or other similar device, thereby electrically isolating the corresponding first contacts 108 from electrical contact with other conductors or signals.

The electrical connector member according to the invention can be employed according to any of the embodiments in order to provide several advantages, if desired. The invention provides the ability to interrupt and disable one or more selected electrical conductors. The invention provides a connector member that reduces or eliminates unwanted electromagnetic interference (EMI). This is achieved without the need for heavy, bulky, and expensive shielding. The invention provides the ability to create a customized electrical connector member. The invention provides an electrical connector member that can be easily and quickly configured at any time before assembly of a system or component. The electrical connector member can likewise be configured even after assembly.

What is claimed is:

1. A multi-conductor electrical connector member, comprising:
    a plurality of electrical conductors arranged on a flexible printed circuit in a spaced apart and generally parallel side-by-side manner, the plurality of electrical conductors including a signal source end, a subset of the electrical conductors being identified as being unneeded for carrying signals; and
    at least one electrical discontinuity formed in the subset of the plurality of electrical conductors, the at least one electrical discontinuity formed proximate the signal source end and comprising at least one opening defined by and passing entirely through a portion of said electrical connector member and entirely through a portion of said subset of electrical conductors.

2. A multi-conductor electrical connector member, comprising:
    a plurality of electrical conductors arranged in a spaced apart and generally parallel side-by-side manner, the plurality of electrical conductors each including a signal source end, the signal source end including a plurality of first contacts, the first contacts in electrical contact with corresponding ones of the plurality of electrical conductors, a subset of the electrical conductors being identified as being unneeded for carrying signals; and
    at least one electrical discontinuity comprising an opening defined at least in part by and passing entirely through at least a portion of a subset of the plurality of first contacts.

3. A method of improving the electromagnetic characteristics of a standard electrical connector member utilized in a particular application, the electrical connector member having a signal source end and a plurality of continuous electrical conductors arranged on a flexible printed circuit in a spaced apart and generally parallel side-by-side manner, said method comprising:
    identifying a subset of the continuous electrical conductors that is unneeded for carrying signals in the particular application; and
    forming proximate said signal source end at least one opening defined by and passing entirely through a portion of the electrical connector member and entirely through a portion of the subset of unneeded electrical conductors to thereby create an electrical discontinuity in the subset of the heretofore continuous electrical conductors.

* * * * *